US011230076B2

(12) United States Patent
Wang et al.

(10) Patent No.: US 11,230,076 B2
(45) Date of Patent: Jan. 25, 2022

(54) DEVICE TRANSFERRING APPARATUS

(71) Applicants: BEIJING BOE DISPLAY TECHNOLOGY CO., LTD., Beijing (CN); BOE TECHNOLOGY GROUP CO., LTD., Beijing (CN)

(72) Inventors: Fei Wang, Beijing (CN); Wanxian Xu, Beijing (CN); Xue Dong, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 175 days.

(21) Appl. No.: 16/445,734

(22) Filed: Jun. 19, 2019

(65) Prior Publication Data
US 2020/0031074 A1 Jan. 30, 2020

(30) Foreign Application Priority Data

Jul. 25, 2018 (CN) .......................... 201810826603.5

(51) Int. Cl.
*B30B 1/34* (2006.01)
*B30B 1/38* (2006.01)
(Continued)

(52) U.S. Cl.
CPC .................. *B30B 1/34* (2013.01); *B30B 1/38* (2013.01); *B30B 15/168* (2013.01); *H01L 24/83* (2013.01);
(Continued)

(58) Field of Classification Search
CPC ..... H01L 2224/291; H01L 2924/00014; H01L 2924/014; H01L 21/67144;
(Continued)

(56) References Cited

U.S. PATENT DOCUMENTS 4,441,791 A 4/1984 Hornbeck
6,662,611 B2 * 12/2003 Janssen ................ B21D 26/041
29/421.1
(Continued)

FOREIGN PATENT DOCUMENTS

CN 1694236 A 11/2005
CN 105575858 A 5/2016
(Continued)

OTHER PUBLICATIONS

First Office Action dated Mar. 24, 2020 corresponding to Chinese application No. 201810826603.5.

*Primary Examiner* — Minh N Trinh
(74) *Attorney, Agent, or Firm* — Nath, Goldberg & Meyer; Joshua B. Goldberg

(57) ABSTRACT

The present disclosure provides a device transferring apparatus and a device transferring method, comprising: a controlling component and a punching component, the punching component is located at one side of the controlling component; the punching component comprises at least one punching head movable in a first direction; and the controlling component comprises a protruding portion corresponding to the at least one punching head and capable of protruding toward the corresponding punching head, the protruding portion pushes the punching head to move in the first direction by protruding the protruding portion.

8 Claims, 2 Drawing Sheets

(51) Int. Cl.
  *B30B 15/16*   (2006.01)
  *H01L 23/00*   (2006.01)
  *B30B 15/00*   (2006.01)
  *H05K 13/04*   (2006.01)
  *H01L 21/67*   (2006.01)

(52) U.S. Cl.
  CPC ..... *B30B 15/0052* (2013.01); *H01L 21/67144* (2013.01); *H05K 13/04* (2013.01); *H05K 13/0417* (2013.01); *H05K 13/0469* (2013.01)

(58) Field of Classification Search
  CPC . H01L 2221/68363; H01L 2224/29139; H01L 24/83; H05K 13/04; B30B 15/0052
  See application file for complete search history.

(56) References Cited

U.S. PATENT DOCUMENTS

| | | | | |
|---|---|---|---|---|
| 6,955,070 | B2 * | 10/2005 | Schult | B21D 26/035 |
| | | | | 29/421.1 |
| 8,390,547 | B2 * | 3/2013 | Chui | G02B 26/001 |
| | | | | 345/85 |
| 10,937,559 | B2 * | 3/2021 | Wang | G02B 21/32 |
| 2020/0031074 | A1 * | 1/2020 | Wang | H01L 24/75 |

FOREIGN PATENT DOCUMENTS

| | | | |
|---|---|---|---|
| CN | 106910700 A | 6/2017 | |
| CN | 107799455 A | 3/2018 | |
| KR | 1020040085492 A | 10/2004 | |

* cited by examiner

DEVICE TRANSFERRING APPARATUS

CROSS-REFERENCE TO RELATED APPLICATION

This application claims the priority of China Patent Application No. 201810826603.5, filed to the China National Intellectual Property Administration (CNIPA) on Jul. 25, 2018, entitled "DEVICE TRANSFERRING APPARATUS AND DEVICE TRANSFERRING METHOD", the entire contents of which are hereby incorporated by reference.

TECHNICAL FIELD

The present disclosure relates to the field of display device processing, and in particular, to a device transferring apparatus and device transferring method.

BACKGROUND

After the preparation process of the display substrate is completed, it is also necessary to fix a device such as an LED chip or a semiconductor chip on the display substrate. At present, it is common to use a suction cup to grasp a device to be fixed, then perform transfer, and finally fix the device to be fixed on the display substrate.

However, in practical applications, it is found that since the number of devices to be fixed grasped by the suction cup each time is limited, it is necessary to repeat the above operations of grasping, transferring, and fixing. The work process is cumbersome, and the processing efficiency is low.

SUMMARY

An embodiment of the present disclosure provides a device transferring apparatus, comprising: a controlling component and a punching component, wherein the punching component is located at one side of the controlling component; wherein the punching component comprises at least one punching head movable in a first direction; and the controlling component comprises a protruding portion corresponding to the at least one punching head and capable of protruding toward the corresponding punching head, the protruding portion pushes the punching head to move in the first direction by protruding the protruding portion.

Optionally, the controlling component further comprises a microfluidic control substrate; and the microfluidic control substrate comprises a cavity for containing a fluid, the cavity has an inflow port and at least one outflow port, the outflow port is located at a side of the cavity facing the punching component, the outflow port is corresponding to the protruding portion, the fluid flowing out from the outflow port is able to push the protruding portion to protrude toward the corresponding punching head.

Optionally, the side of the cavity facing the punching component is covered with a flexible film, and a portion of the flexible film covering the outflow port constitutes the protruding portion.

Optionally, the punching component further comprises a support member, a side of the support member facing the controlling component is provided with at least one receiving groove corresponding to the punching head, and a bottom of the receiving groove has a through hole penetrating the support member; and the punching head is located in the corresponding receiving groove, and an end of the punching head facing away from the protruding portion protrudes through the through hole when the protruding portion pushes the punching head to move in the first direction.

Optionally, the punching head comprises a force receiving portion and a protrusion integral with the force receiving portion, the force receiving portion is located between the protrusion and the corresponding protruding portion; and the through hole is configured to restrict movement of the force receiving portion in the first direction without restricting movement of the protrusion in the first direction.

Optionally, a cross-sectional area of the force receiving portion in a cross section perpendicular to the first direction is larger than a cross-sectional area of the protrusion in a cross section perpendicular to the first direction; and the cross-sectional area of the force receiving portion in the cross section perpendicular to the first direction is larger than a cross-sectional area of the through hole in a cross section perpendicular to the first direction.

Optionally, the punching component further comprises an elastic member; and the elastic member is disposed between the force receiving portion and the bottom of the receiving groove, so as to provide a biasing force for the punching head relative to the receiving groove.

Optionally, a side of the punching component facing away from the controlling component is provided with a flexible substrate.

Optionally, the number of the punching heads is plural.

Optionally, the outflow port has a plurality of holes, and all the holes located at the same outflow port are uniformly arranged.

Another embodiment of the present disclosure provides a device transferring method, the device transferring method is based on the above device transferring apparatus. The device transferring method comprises: positioning a device to be transferred on a side of the punching head facing away from the protruding portion; and controlling the protruding portion to protrude toward the corresponding punching head to push the punching head to move in the first direction, so that the device to be transferred is connected to a target structure.

Optionally, when applying the device transferring method to the above device transferring apparatus, the step of controlling the protruding portion to protrude toward the corresponding punching head comprises: delivering the fluid to the cavity through the inflow port, and the fluid flowing out of the outflow port pushing the protruding portion to protrude toward the corresponding punching head.

DETAILED DESCRIPTION OF THE EMBODIMENTS

In order to enable those skilled in the art to better understand the technical solutions of the present disclosure, a device transferring apparatus and a device transferring method provided by the present disclosure are described in detail below with reference to the accompanying drawings.

Figure 1:
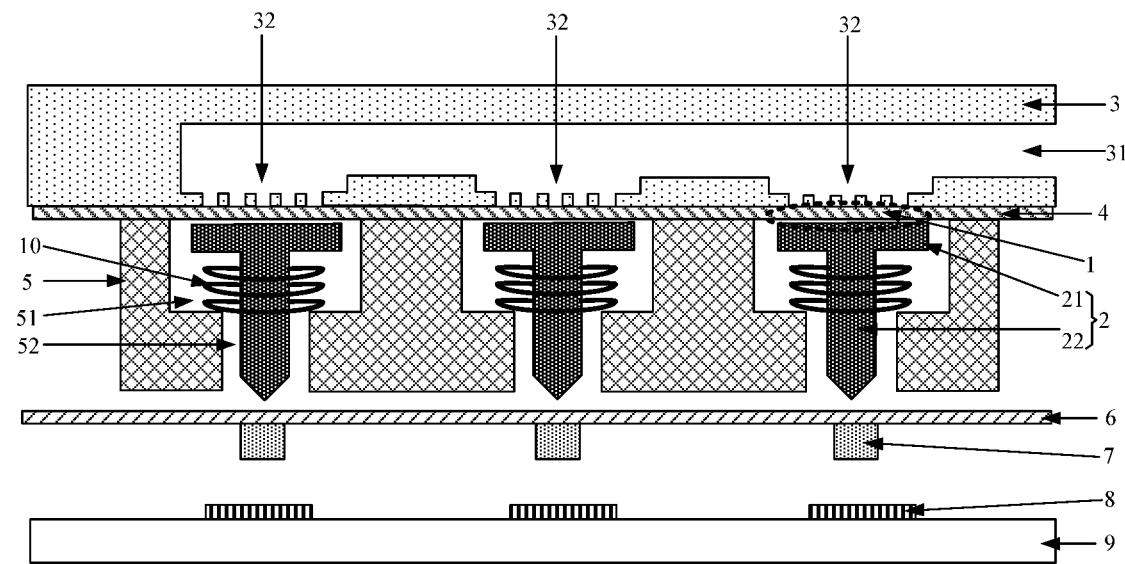
FIG. 1 is a schematic structural diagram of a device transferring apparatus according to an embodiment of the present disclosure.
Figure 2:
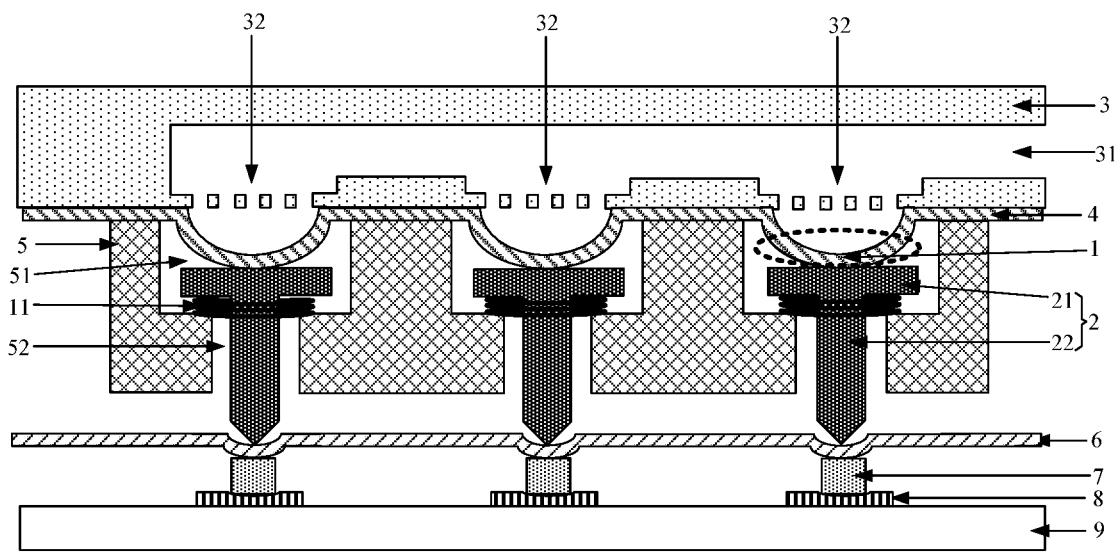
FIG. 2 is a schematic diagram of the device transferring apparatus of FIG. 1 in a running state.

FIG. 1 is a schematic structural diagram of a device transferring apparatus according to an embodiment of the present disclosure; and FIG. 2 is a schematic diagram of the device transferring apparatus of FIG. 1 in a running state. As shown in FIGS. 1 and 2, the device transferring apparatus is configured to connect a device to be transferred 7 (for example, an LED chip, a semiconductor chip) to a target structure 9 (for example, a display substrate).

The device transferring apparatus includes a controlling component and a punching component. The punching component is located at one side of the controlling component. The punching component includes at least one punching head 2 movable in a first direction; and the controlling component includes a protruding portion 1 corresponding to the punching head 2 and capable of protruding toward the corresponding punching head 2. The protruding portion 1 pushes the punching head 2 to move in the first direction by protruding the protruding portion 1.

In the present embodiment, the first direction is a vertical direction (i.e., the up and down direction in FIG. 1) as an example for exemplary description.

In practical application, the device to be transferred 7 can be first disposed on the side of the punching head 2 facing away from the protruding portion 1, and then the target structure 9 is disposed directly under the device to be transferred 7, so that the device to be transferred 7 is aligned with an area to be fixed. The region to be fixed 8 is preliminarily provided with an adhesive 8 (such as solder paste and silver paste). Then, the protruding portion 1 is controlled to protrude toward the corresponding punching head 2, so as to push the corresponding punching head 2 to move downward. At this time, the punching head 2 pushes the device 7 to be transferred downward, and the device to be transferred 7 is connected to the region to be fixed on the target structure 9. At this time, the device to be transferred 7 is bonded to the target structure 9 by the adhesive 8 on the area to be fixed. In the subsequent process, the degree of firmness between the device to be transferred 7 and the target structure 9 can be further strengthened by means of reflow soldering or the like, so that the device to be transferred 7 can be stably connected to the target structure 9.

It should be noted that the manner in which the adhesive is used to fix the device to be transferred 7 and the target structure 9 in the present disclosure is merely exemplary, and it does not limit the technical solution of the present disclosure. Other technical solutions may also be adopted in the present disclosure to implement the fixing of the device to be transferred 7 and the target structure 9, which will not be exemplified herein.

Compared with the existing art, the device transferring apparatus provided by the present disclosure can transfer the device to be transferred 7 more conveniently and quickly, and the device to be transferred 7 can be efficiently connected and fixed to the target structure 9.

In at least one embodiment, the number of the punching heads 2 is plural. In this case, the device transferring apparatus can simultaneously operate a plurality of devices to be transferred 7, thereby greatly improving work efficiency.

Figure 3:
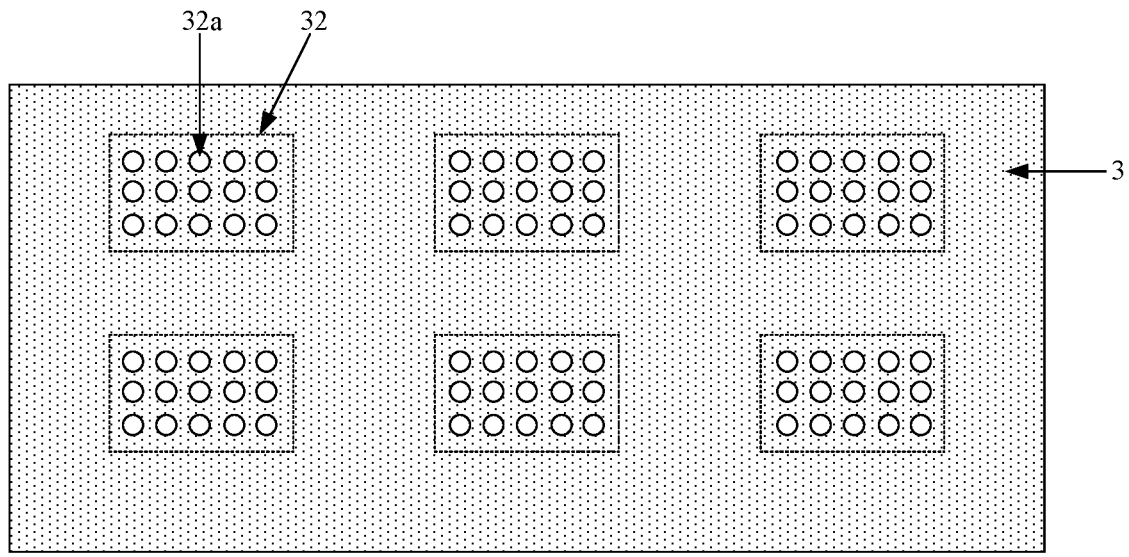
FIG. 3 is a bottom view of a microfluidic control substrate.

FIG. 3 is a bottom view of a microfluidic control substrate in the present disclosure. As shown in FIG. 3, alternatively, the controlling component further includes a microfluidic control substrate. The microfluidic control substrate includes a cavity 3 for containing a fluid; the cavity 3 has an inflow port 31 and at least one outflow port 32. The outflow port 32 is located at a side of the cavity 3 facing the punching component. The outflow port 32 is corresponding to the protruding portion 1; the fluid flowing out from the outflow port 32 is able to push the protruding portion 1 to protrude toward the corresponding punching head 2.

In the present disclosure, the position at which the outflow port 32 is disposed corresponds to the position of the punching head 2. When the number of the punching heads 2 is plural, the number of the outflow ports 32 is also plural. All of the outflow ports 32 can be arranged in an array, as shown in FIG. 3.

Optionally, the outflow port 32 has a plurality of holes 32a, and all the holes 32a located at the same outflow port 32 are uniformly arranged. The words "uniformly arranged" here means that row spacing between each of the holes 32a arranged in an array is equal and column spacing between each of the holes 32a arranged in the array is equal. A desired pressure at the protruding portion can be adjusted by providing the holes 32a; and a limited array design can be used to meet a variety of different spacing requirements.

Further optionally, the side of the cavity 3 facing the punching component is covered with a flexible film 4, and a portion of the flexible film 4 covering the outflow port 32 constitutes the protruding portion 1. The flexible film 4 is attached to a surface of the cavity 3 facing the punching component, and has certain flexibility. When the fluid enters the cavity 3 through the inflow port 31 and the pressure at the outflow port 32 reaches a certain value, the flexible film 4 at the outflow port 32 protrudes downward under the pressure of the fluid. The protruding flexible film 4 pushes the punching head 2 to move downward. It should be noted that the degree of protrusion of the flexible film 4 is related to the density and flow rate of the fluid.

It should be noted that when the number of the punching heads 2 is plural, the number of the outflow ports 32 correspondingly disposed on the cavity 3 is also plural. Since the pressure at each of the outflow ports 32 is always the same, the degree of protrusion of the flexible film 4 at each of the outflow ports 32 is also the same, thereby ensuring the consistency in the operation performed simultaneously to the plurality of devices 7 to be transferred.

In the present disclosure, the degree of protrusion of the protruding portion 1 can be precisely controlled based on the microfluidic technology.

Optionally, the punching component further includes a support member 5; a side of the support member 5 facing the controlling component is provided with at least one receiving groove 51 corresponding to the punching head 2; and a bottom of the receiving groove 51 has a through hole 52 penetrating the support member 5. The punching head 2 is located in the corresponding receiving groove 51. An end of the punching head 2 facing away from the protruding portion 1 protrudes through the through hole 52 when the protruding portion 1 pushes the punching head 2 to move in the first direction.

Further, the punching head 2 includes a force receiving portion 21 and a protrusion 22 integral with the force receiving portion 21. The force receiving portion 21 is located between the protrusion 22 and the corresponding protruding portion 1. The through hole 52 is configured to restrict movement of the force receiving portion 21 in the first direction without restricting movement of the protrusion 22 in the first direction. Thereby, the protrusion 22 can protrude from the through hole 52, and the force receiving portion 21 is restricted from protruding from the through hole 52.

As an embodiment, a cross-sectional area of the force receiving portion 21 in a cross section perpendicular to the first direction is larger than a cross-sectional area of the protrusion in a cross section perpendicular to the first direction; and the cross-sectional area of the force receiving portion 21 in the cross section perpendicular to the first direction is larger than a cross-sectional area of the through hole 52 in a cross section perpendicular to the first direction.

In the present disclosure, the cross-sectional area of the force receiving portion 21 in the cross section perpendicular to the first direction is denoted as S1, the cross-sectional area of the protrusion 22 in the cross section perpendicular to the first direction is denoted as S2, and the cross-sectional area of the through hole 52 in the cross section perpendicular to the first direction is denoted as S3, and those S1, S2 and S3 satisfy S1>S3>S2. The above design ensures that the protrusion 22 can protrude from the through hole 52, but the force receiving portion 21 cannot protrude from the through hole 52, so that the punching head 2 can be prevented from coming off.

As another embodiment, as shown in FIG. 1, in the plane of the cross-sectional view parallel to the first direction (the vertical direction in FIG. 1), the width of the force receiving portion 21 is larger than the width of the through hole 52, and the width of the through hole 52 is larger than the width of the protrusion 22. In this case, the protrusion 22 can also protrude from the through hole 52, and the force receiving portion 21 is restricted from protruding from the through hole 52.

Further, the punching component further includes an elastic member 10; and the elastic member 10 is disposed between the force receiving portion 21 and the bottom of the receiving groove 51 to provide a biasing force for the punching head 2 relative to the receiving groove 51. In practical application, the punching head 2 can be moved downward by the pushing action of the protruding portion 1, but the punching head 2 cannot be retracted by itself when the protruding portion 1 returns to an initial state. In order to solve this technical problem, an elastic member 10 is provided in the present disclosure, and when the protruding portion 1 returns to the initial state, the elastic member generates a vertical upward thrust force on the force receiving portion (i.e., the biasing force relative to the receiving groove). The biasing force causes the force receiving portion 21 and the protrusion 22 move upward at the same time, that is, the reset of the punching head 2 is achieved.

It should be noted that, in the drawings, only the case where the elastic member 10 is sleeved outside the protrusion is schematically illustrated, which does not limit the technical solution of the present disclosure. In the present disclosure, the elastic member 10 may also be integrally provided on the side of the protrusion, in which case the corresponding drawings are not given.

In addition, the number of the elastic members 10 provided in each of the receiving grooves 51 is not limited in the present disclosure. For example, each of the receiving grooves 51 may be provided with two elastic members 10, and the two elastic members are located on the left and right sides of the protrusion in the drawing, respectively. For other cases, the description will not be repeated herein.

In at least one embodiment, a side of the punching component facing away from the controlling component is provided with a flexible substrate 6. In the present disclosure, the device to be transferred 7 can be directly disposed on the surface of the flexible substrate 6 facing away from the punching head 2 (for example, the device to be transferred 7 and the flexible substrate 6 are fixed by a tape or an adhesive) and correspond to the region of the punching head 2. Therefore, it is not necessary to additionally provide a structure for fixing the device to be transferred 7 in the process of transferring the device to be transferred 7.

In practical application, when the punching head 2 moves downward, the lower end of the punching head 2 will come into contact with the flexible substrate 6, and the flexible substrate 6 will be deformed downwardly. Accordingly, downward protrusion of the flexible substrate 6 causes the device to be transferred 7 at a corresponding position to move downward. When the device to be transferred 7 is moved downward by a certain distance, the device to be transferred 7 is connected to the region to be fixed on the target structure 9, and the device to be transferred 7 is bonded to the target structure 9 by the adhesive on the region to be fixed.

It should be noted that, in the present disclosure, the flexible substrate 6 can move downward as a whole along with the punching head 2. Alternatively, the flexible substrate 6 is integrally fixed, and only the portion of the flexible substrate 6 that is in contact with the punching head 2 is deformed downwardly. Alternatively, the flexible substrate 6 moves downward as a whole along with the punching head 2 to a certain distance, and then stop; during a subsequent downward movement of the punching head 2, only a portion of the flexible substrate 6 that is in contact with the punching head 2 is deformed downwardly. The above three cases are all within the scope of protection of the present disclosure.

In the present disclosure, the flexible substrate 6 not only allows the device to be transferred 7 to be fixed during the transfer process, but also prevents the device to be transferred 7 from moving further downward after the device to be transferred 7 contacts the target structure 9 (in this case the flexible substrate 6 undergoes compression deformation). Thereby, preventing an excessive force between the device to be transferred 7 and the target structure 9, and both the device to be transferred 7 and the target structure 9 are protected.

It should be noted that, after fixing of the device to be transferred 7 and the target structure 9 is completed, the punching head 2 can be controlled to move upward to return to the initial state. Specifically, the fluid is stopped from being transported to the cavity 3, and the pressure generated by the fluid in the cavity 3 is reduced, and the flexible film 4 is gradually restored to a flat state under the action of its own elastic force. At the same time, under the action of the elastic member 10, the punching head 2 moves vertically upward and returns to the initial state. During the upward movement of the punching head 2 to return to the initial state, the flexible substrate 6 separates from the device to be transferred 7 under the action of its own elasticity, but it is insufficient to separate the device to be transferred 7 from the target structure 9 (the maximum pulling force between the flexible substrate 6 and the device to be transferred 7 is less than the maximum pulling force between the device to be transferred 7 and the target structure 9).

An embodiment of the present disclosure provides a device transferring apparatus, which can transfer the device to be transferred more conveniently and quickly, and the device to be transferred can be efficiently connected and fixed to the target structure. In addition, the device transferring apparatus can simultaneously operate a plurality of devices to be transferred, thereby greatly improving work efficiency.

Figure 4:
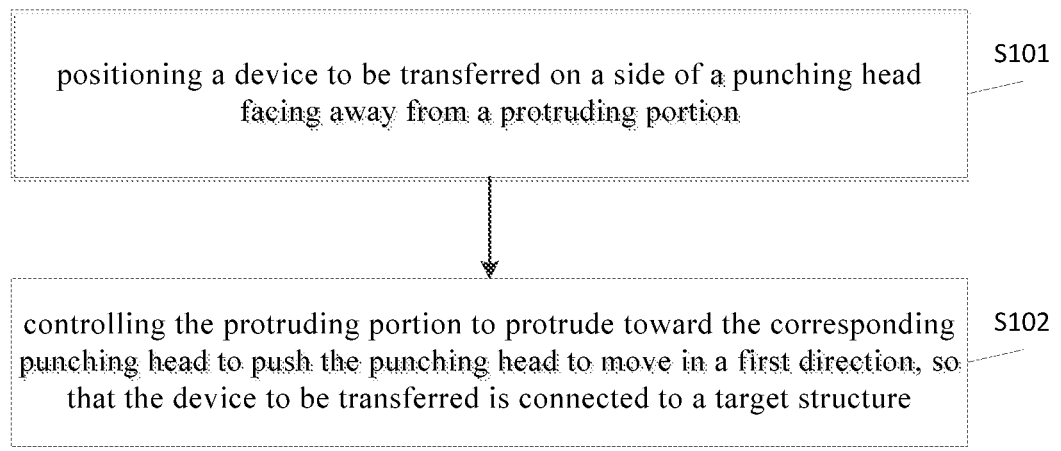
FIG. 4 is a flowchart of a device transferring method according to another embodiment of the present disclosure.

FIG. 4 is a flowchart of a device transferring method according to another embodiment of the present disclosure. As shown in FIG. 4, the device transferring method is based on the device transferring apparatus adopted in the above embodiments. For the description of the device transferring apparatus, please refer to the content in the above embodiments, and details are not described herein again. The device transferring method includes:

Step S101: positioning a device to be transferred on a side of the punching head facing away from the protruding portion;

Step S102: controlling the protruding portion to protrude toward the corresponding punching head to push the punching head to move in the first direction, so that the device to be transferred is connected to a target structure.

In the case that the controlling component includes a microfluidic control substrate, the step S2 particularly includes: delivering the fluid to the cavity through the inflow port, and the fluid flowing out of the outflow port pushing the protruding portion (flexible film) to protrude toward the corresponding punching head.

For the detailed description of the Step S1 (S101 and S102) and the Step S2, please refer to the corresponding contents in the foregoing embodiment, and details are not described herein again.

An embodiment of the present disclosure provides a device transferring method. The device transferring method is based on the device transferring apparatus, which can transfer the device to be transferred more conveniently and quickly, and the device to be transferred can be efficiently connected and fixed to the target structure. In addition, the device transferring apparatus can simultaneously operate a plurality of devices to be transferred, thereby greatly improving work efficiency.

It is to be understood that the above embodiments are merely exemplary embodiments employed to explain the principles of the present disclosure, but the present disclosure is not limited thereto. Various modifications and improvements can be made by those skilled in the art without departing from the spirit and scope of the disclosure, and such modifications and improvements are also considered to be within the scope of the disclosure.

What is claimed is:

1. A device transferring apparatus, comprising: a controlling component and a punching component, wherein the punching component is located at one side of the controlling component; wherein
    the punching component comprises at least one punching head movable in a first direction; and
    the controlling component comprises a protruding portion corresponding to the at least one punching head and capable of protruding toward the corresponding punching head, the protruding portion pushes the punching head to move in the first direction by protruding the protruding portion, wherein
    the controlling component further comprises a microfluidic control substrate; and
    the microfluidic control substrate comprises a cavity for containing a fluid, the cavity has an inflow port and at least one outflow port, the outflow port is located at a side of the cavity facing the punching component, the outflow port is corresponding to the protruding portion, the fluid flowing out from the outflow port is able to push the protruding portion to protrude toward the corresponding punching head, and wherein
    the side of the cavity facing the punching component is covered with a flexible film, and a portion of the flexible film covering the outflow port constitutes the protruding portion.

2. The device transferring apparatus according to claim 1, wherein
    the punching component further comprises a support member, a side of the support member facing the controlling component is provided with at least one receiving groove corresponding to the punching head, and a bottom of the receiving groove has a through hole penetrating the support member; and
    the punching head is located in the corresponding receiving groove, and an end of the punching head facing away from the protruding portion protrudes through the through hole when the protruding portion pushes the punching head to move in the first direction.

3. The device transferring apparatus according to claim 2, wherein
    the punching head comprises a force receiving portion and a protrusion integral with the force receiving portion, the force receiving portion is located between the protrusion and the corresponding protruding portion; and
    the through hole is configured to restrict movement of the force receiving portion in the first direction without restricting movement of the protrusion in the first direction.

4. The device transferring apparatus according to claim 3, wherein
    a cross-sectional area of the force receiving portion in a cross section perpendicular to the first direction is larger than a cross-sectional area of the protrusion in a cross section perpendicular to the first direction; and
    the cross-sectional area of the force receiving portion in the cross section perpendicular to the first direction is larger than a cross-sectional area of the through hole in a cross section perpendicular to the first direction.

5. The device transferring apparatus according to claim 4, wherein
    the punching component further comprises an elastic member; and
    the elastic member is disposed between the force receiving portion and the bottom of the receiving groove, so as to provide a biasing force for the punching head relative to the receiving groove.

6. The device transferring apparatus according to claim 3, wherein
    a side of the punching component facing away from the controlling component is provided with a flexible substrate.

7. The device transferring apparatus according to claim 6, wherein the number of the punching heads is plural.

8. The device transferring apparatus according to claim 7, wherein the outflow port has a plurality of holes, and all the holes located at the same outflow port are uniformly arranged.

* * * * *